United States Patent
Yin et al.

(10) Patent No.: US 12,197,065 B2
(45) Date of Patent: Jan. 14, 2025

(54) OPTICAL FILM AND DISPLAY DEVICE

(71) Applicant: Shenzhen China Star Optoelectronics Semiconductor Display Technology Co., Ltd., Guangdong (CN)

(72) Inventors: Zhiyuan Yin, Guangdong (CN); Lixuan Chen, Guangdong (CN); Ming Xu, Guangdong (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 0 days.

(21) Appl. No.: 17/607,470

(22) PCT Filed: Sep. 17, 2021

(86) PCT No.: PCT/CN2021/119121
§ 371 (c)(1),
(2) Date: Oct. 29, 2021

(87) PCT Pub. No.: WO2023/019674
PCT Pub. Date: Feb. 23, 2023

(65) Prior Publication Data
US 2024/0027657 A1    Jan. 25, 2024

(30) Foreign Application Priority Data
Aug. 19, 2021    (CN) .......................... 202110952725.0

(51) Int. Cl.
*G02B 3/08*    (2006.01)
*G02F 1/1335*    (2006.01)
*H10K 59/80*    (2023.01)

(52) U.S. Cl.
CPC ......... *G02F 1/133526* (2013.01); *G02B 3/08* (2013.01); *G02F 1/133528* (2013.01); *H10K 59/879* (2023.02)

(58) Field of Classification Search
None
See application file for complete search history.

(56) References Cited

U.S. PATENT DOCUMENTS

2006/0176565 A1    8/2006    Nagao
2022/0163844 A1*    5/2022    Kim .................. G02F 1/133562

FOREIGN PATENT DOCUMENTS

| CN | 1306625 | 8/2001 |
|---|---|---|
| CN | 202975376 | 6/2013 |
| CN | 106684256 | 5/2017 |
| CN | 106896575 | 6/2017 |
| CN | 108302402 | 7/2018 |
| CN | 211123564 | 7/2020 |

(Continued)

*Primary Examiner* — Phu Vu

(57) ABSTRACT

An optical film and a display device are provided. The optical film includes a substrate and a plurality of protrusions disposed on a surface of the substrate. The protrusion includes a center plane, a first inclined surface, and a second inclined surface. The first inclined surface is connected to the center plane. The first inclined surface extends away from the surface of the substrate in a direction away from the center plane. The second inclined surface is connected between the first inclined surface and the surface of the substrate. The second inclined surface approaches the surface of the substrate in the direction away from the center plane.

16 Claims, 11 Drawing Sheets

(56) References Cited

FOREIGN PATENT DOCUMENTS

| | | |
|---|---|---|
| CN | 111796349 | 10/2020 |
| JP | 2006-128072 | 5/2006 |
| JP | 2006-251660 | 9/2006 |
| JP | 2009-152152 | 7/2009 |
| JP | 2009-258666 | 11/2009 |
| WO | WO 2007/066729 | 6/2007 |

\* cited by examiner

OPTICAL FILM AND DISPLAY DEVICE

RELATED APPLICATIONS

This application is a National Phase of PCT Patent Application No. PCT/CN2021/119121 having International filing date of Sep. 17, 2021, which claims the benefit of priority of China Patent Application No. 202110952725.0 filed on Aug. 19, 2021. The contents of the above applications are all incorporated by reference as if fully set forth herein in their entirety.

FIELD AND BACKGROUND OF THE INVENTION

The present disclosure relates to the field of display technologies, in particular to an optical film and a display device.

Increasing panel size and resolution is a main development direction of liquid crystal displays (LCD) and organic light-emitting diode (OLED) displays. With the increase in panel size and resolution, a large viewing angle performance of the display is getting worse and worse, and changing a light output and a device structure has little effect on improving viewing angles. To solve this problem, in industries, external optical solutions are usually used to improve the large viewing angle performance of the display. One of the most common ways is to add viewing angle improvement films with different optical microstructures on the display to achieve a purpose of improving the large viewing angle performance of the display.

However, due to limitations of a current technological level, the microstructure of the viewing angle improvement film used on markets is relatively simple and regular. It can only improve angles of an emitted light in a larger range, but cannot achieve fine control of the angles of the emitted light in a small range.

SUMMARY OF THE INVENTION

Accordingly, an object of the present disclosure is to provide an optical film and a display device that can achieve fine control of angles of an emitted light.

The present disclosure provides an optical film, which includes a substrate and protrusions disposed on a surface of the substrate, and each of the protrusions includes:
  a center plane parallel to the surface of the substrate;
  a first inclined surface connected to the center plane, wherein the first inclined surface extends away from the surface of the substrate in a direction away from the center plane; and
  a second inclined surface connected between the first inclined surface and the surface of the substrate, wherein the second inclined surface is disposed on a side of the first inclined surface away from the center plane, and the second inclined surface approaches the surface of the substrate in the direction away from the center plane.

In one embodiment, each of the protrusions further includes a first connection surface, the first connection surface is connected between the first inclined surface and the second inclined surface, and the first connection surface is parallel to the surface of the substrate.

In one embodiment, each of the protrusions further includes a first sub-connection surface and a second sub-connection surface, and the first sub-connection surface and the second sub-connection surface are connected between the first inclined surface and the second inclined surface.

The first sub-connection surface is connected between the first inclined surface and the second sub-connection surface, the first sub-connection surface is inclined with respect to the surface of the substrate, and the first sub-connection surface extends away from the surface of the substrate in the direction away from the center plane.

The second sub-connection surface is connected between the first sub-connection surface and the second inclined surface, the second sub-connection surface is inclined with respect to the surface of the substrate, and the second sub-connection surface is close to the surface of the substrate in the direction away from the center plane.

In one embodiment, each of the protrusions further includes a third inclined surface and a fourth inclined surface.

The third inclined surface is connected to the center plane, and the third inclined surface extends away from the surface of the substrate in the direction away from the center plane.

The fourth inclined surface is connected between the third inclined surface and the surface of the substrate, and the fourth inclined surface is disposed on a side of the third inclined surface away from the center plane, and the fourth inclined surface approaches the surface of the substrate in the direction away from the center plane.

In one embodiment, each of the protrusions includes a symmetry plane, the center plane is symmetrical with respect to the symmetry plane, the third inclined surface is symmetrical to the first inclined surface with respect to the symmetry plane, and the fourth inclined surface is symmetrical to the second inclined surface with respect to the symmetry plane.

In one embodiment, each of the protrusions further includes:
  a fifth inclined surface connected to the center plane, and connected between the first inclined surface and the third inclined surface, wherein the fifth inclined surface extends away from the surface of the substrate in the direction away from the center plane;
  a sixth inclined surface connected between the fifth inclined surface and the surface of the substrate, and connected between the second inclined surface and the fourth inclined surface, wherein the sixth inclined surface is disposed on a side of the fifth inclined surface away from the center plane, and the sixth inclined surface approaches the surface of the substrate in the direction away from the center plane;
  a seventh inclined surface connected to the center plane, and connected between the first inclined surface and the third inclined surface, wherein the seventh inclined surface extends away from the surface of the substrate in the direction away from the center plane; and
  an eighth inclined surface connected between the seventh inclined surface and the surface of the substrate, and connected between the second inclined surface and the fourth inclined surface, wherein the eighth inclined surface is disposed on a side of the seventh inclined surface away from the center plane, and the eighth inclined surface approaches the surface of the substrate in the direction away from the center plane.

In one embodiment, each of the protrusions includes a first symmetry plane and a second symmetry plane, the first symmetry plane is perpendicular to the second symmetry plane, the center plane is symmetrical with respect to the first symmetry plane and the second symmetry plane, the third inclined surface is symmetrical to the first inclined surface with respect to the first symmetry plane, the fourth inclined surface is symmetrical to the second inclined surface with respect to the first symmetry plane, the seventh inclined surface is symmetrical to the fifth inclined surface with respect to the second symmetry plane, and the eighth inclined surface is symmetrical to the sixth inclined surface with respect to the second symmetry plane.

In one embodiment, each of the protrusions is a frustum with a recess, the recess is a frustum with an inverted trapezoidal cross-section, a bottom surface of the recess is the center plane, one side surface of the recess is the first inclined surface, and an outer side surface of the frustum is the second inclined surface.

In one embodiment, each of the protrusions is a frustum with a recess, a top surface of the protrusion is the center plane, and one side wall of the recess is the first inclined surface.

In one embodiment, the optical film further includes a planarization layer. A refractive index of the planarization layer is greater than a refractive index of the substrate and a refractive index of the protrusion, and the refractive index of the protrusion is greater than or equal to the refractive index of the substrate.

The present disclosure also provides a display device, including the above-described optical film and a display panel, and the optical film is disposed on a light-emitting side of the display panel.

In one embodiment, the display panel is a liquid crystal display panel, and the display device further includes an upper polarizer disposed on the light-emitting side of the liquid crystal display panel, the upper polarizer serves as the substrate, the protrusions are disposed on the upper polarizer, and an anti-reflection film is disposed on a light-emitting side of the optical film.

In one embodiment, the display panel is an organic light-emitting diode display panel, the organic light-emitting diode display panel includes an encapsulation layer, the encapsulation layer includes a first encapsulation layer and a second encapsulation layer disposed on the first encapsulation layer, the substrate of the optical film is the first encapsulation layer, and the protrusions are the second encapsulation layer.

The optical film of the present disclosure includes the center plane, the first inclined surface, and the second inclined surface, which respectively adjust the light in different viewing angle ranges. In comparison with the optical film of the prior art, the optical film of the present disclosure can finely adjust angles of light emission, thereby optimizing viewing angle performance of the display device.

BRIEF DESCRIPTION OF THE SEVERAL VIEWS OF THE DRAWINGS

In order to more clearly describe technical solutions in the present disclosure, the following will briefly introduce drawings that need to be used in the description of embodiments. Apparently, the drawings in the following description are only some implementations of the present disclosure. For those skilled in the art, without creative efforts, other drawings can be obtained based on these drawings.

DESCRIPTION OF SPECIFIC EMBODIMENT OF THE INVENTION

Figure 1:
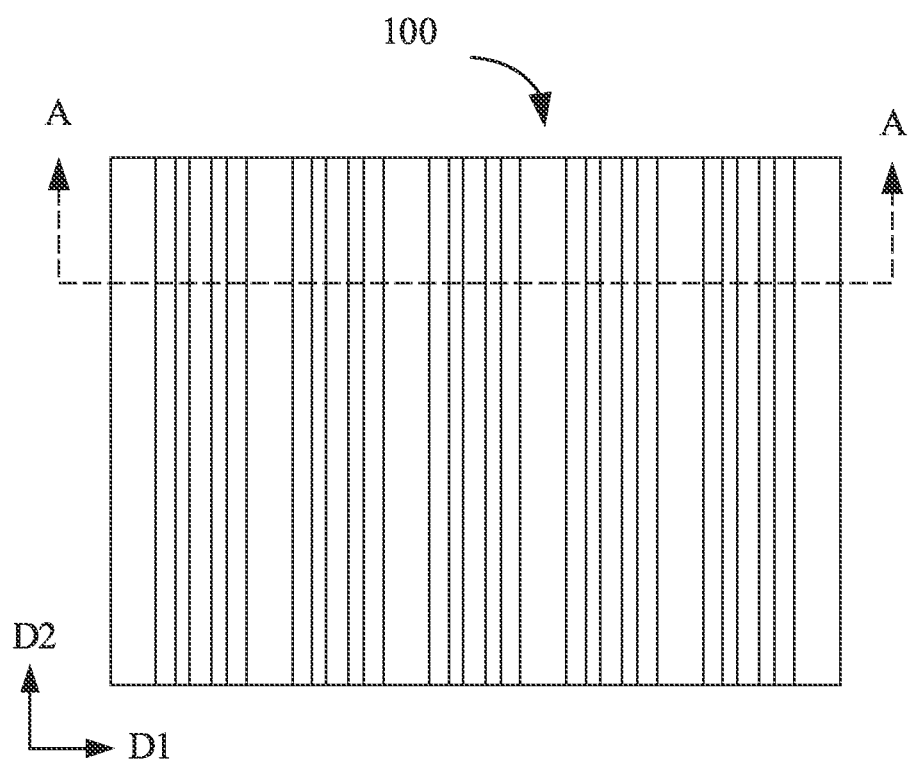
FIG. 1 is a top view of an optical film of a first embodiment of the present disclosure.

The technical solutions in the present disclosure will be clearly and completely described below in conjunction with the drawings in the embodiments of the present disclosure. Apparently, the described embodiments are only a part of embodiments of the present disclosure, rather than all of the embodiments. Based on the embodiments in the present disclosure, all other embodiments obtained by those skilled in the art without creative efforts shall fall within the protection scope of the present disclosure.

In the description of the present disclosure, it is to be understood that orientation or position relationships indicated by terms "center", "longitudinal", "transverse", "length", "width", "thickness", "upper", "lower", "front", "rear", "left", "right", "vertical", "horizontal", "top", "bottom", "inner", "outer", "clockwise", and "counterclockwise" are orientation or position relationships shown on the basis of the drawings, and it is not intended to indicate or imply that related devices or components are required to be at specific orientations and structured and operated at the specific orientations, but only intended to facilitate and simplify the description of the present disclosure, and thus may not be understood as limits to the present disclosure. In the description of the present disclosure, unless otherwise explicitly specified and limited, it is to be noted that, terms "mount", "mutually connect", and "connect" should be broadly understood, and for example, may refer to fixed connection, and may also refer to detachable connection or integrated connection; they may refer to mechanical connection, or may also refer to electrical connection or mutual communication; and they may refer to direct connection, may also refer to indirect connection through an intermediate, or may refer to communication in two components or an interaction relationship of the two components. For those of ordinary skilled in the art, specific meanings of these terms in the present disclosure may be understood according to actual conditions.

In the present disclosure, unless otherwise explicitly specified and limited, term "over" or "under" used to represents a relation between a first feature and a second feature may include that the first and second features directly contact, and may also include that the first and second features do not directly contact but contact through another feature therebetween. Moreover, the expression "first feature is 'over', 'above' and 'on an upper side of' the second feature" includes that the first feature is over and obliquely above the second feature, or only represents that a horizontal height of the first feature is larger than the second feature. The expression "first feature is 'under', 'below' and 'on a lower side of' the second feature" includes that the first feature is under and obliquely below the second feature, or only represents that the horizontal height of the first feature is smaller than the second feature. The implementations of the present disclosure have been described in detail, and specific examples are used herein to illustrate the principle and embodiments of the present disclosure, which are only used to help understand the present disclosure. For those skilled in the art, based on the idea of the present disclosure, there will be changes in the specific implementation and the scope of application. Accordingly, the content of this specification should not be construed as a limitation on the present disclosure.

The present disclosure provides an optical film, which can be used in displays such as liquid crystal displays or organic light-emitting diode displays. The optical film includes a substrate and a plurality of protrusions disposed on a surface of the substrate. Each of the protrusions includes a center plane, a first inclined surface, and a second inclined surface. The center plane is parallel to the surface of the substrate. The first inclined surface is connected to the center plane. The first inclined surface extends away from the surface of the substrate in a direction away from the center plane. The second inclined surface is connected between the first inclined surface and the bottom surface. The second inclined surface is disposed on a side of the first inclined surface away from the center plane. The second inclined surface approaches the surface of the substrate in the direction away from the center plane.

The optical film of the present disclosure includes the center plane, the first inclined surface, and the second inclined surface, which respectively adjust light in different viewing angle ranges. In comparison with an optical film of the prior art, the optical film of the present disclosure can finely adjust angles of light emission, thereby optimizing viewing angle performance of a display device.

Specific embodiments of the present disclosure will be described below with reference to the accompanying drawings.

Figure 2:
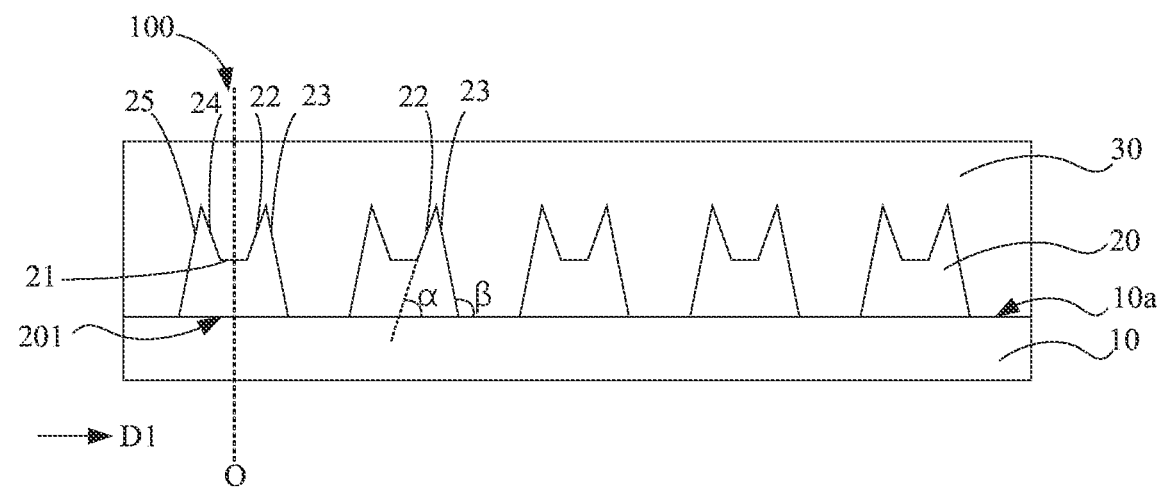
FIG. 2 is a cross-sectional view of the optical film of FIG. 1 along a line A-A.

Referring to FIG. 1 and FIG. 2, an optical film 100 includes a substrate 10 and protrusions disposed on a surface 10a of the substrate. The substrate 10 and the protrusions 20 are made of light-transmitting materials. The substrate 10 and the protrusions 20 can be made of the same light-transmitting material, or they can be made of light-transmitting materials with different refractive indexes. Alternatively, a refractive index of the substrate 10 is less than a refractive index of the protrusions 20. The substrate 10 and the protrusions 20 can be made of flexible materials to meet the needs of flexible display, or they can be made of rigid materials. Alternatively, the optical film 100 further includes a planarization layer 30 covering the protrusions 20 to achieve a finer light splitting performance. A refractive index of the planarization layer 30 is greater than the refractive index of the substrate 10 and the refractive index of the protrusions 20.

It should be noted that the surface 10a of the substrate may be an upper surface of the substrate 10 or a lower surface of the substrate 10. In a case of no special instructions in the present disclosure, the surface 10a of the substrate is the upper surface of the substrate 10 by default. It should be noted that "disposed on" the surface 10a of the substrate 10 may refer to direct contact with the surface 10a of the substrate, or indirect contact.

The protrusion 20 may have a size on the order of micrometers, and thus may also be referred to as a microstructure. The plurality of protrusions 20 are arranged at equal intervals along a first direction D1. Alternatively, the plurality of protrusions 20 may also be arranged at unequal intervals along the first direction D1. A distance between two adjacent protrusions 20 may be referred to as a grating space, and the surface 10a of the substrate between two adjacent protrusions can transmit light, but does not contribute to light splitting. Each of the protrusions 20 extends along a second direction D2. The second direction D2 intersects the first direction D1. Alternatively, the first direction D1 is perpendicular to the second direction D2. In order to simplify a manufacturing process, each of the protrusions 20 can extend from one end of the substrate 10 to the other end. Alternatively, the plurality of protrusions 20 may also be arranged on the substrate in an array.

When the optical film 100 is used with a display panel, the extension direction (the second direction D2) of the protrusions 20 may be an up-down direction when an image is displayed. When the optical film 100 is disposed on the display panel in such a way that the extension direction of the protrusions 20 is the same as the up-down direction of the displayed image, the optical film 100 can optimize a left-right viewing angle performance of the display. Alternatively, when the optical film 100 is disposed on the display panel in such a way that the extension direction of the protrusions 20 is the same as a left-right direction of the displayed image, the optical film 100 can optimize an up-down viewing angle performance of the display. Without considering a light loss, two optical films 100 can also be used in such a way that extension directions of respective protrusions 20 are perpendicular to each other.

Figure 3:
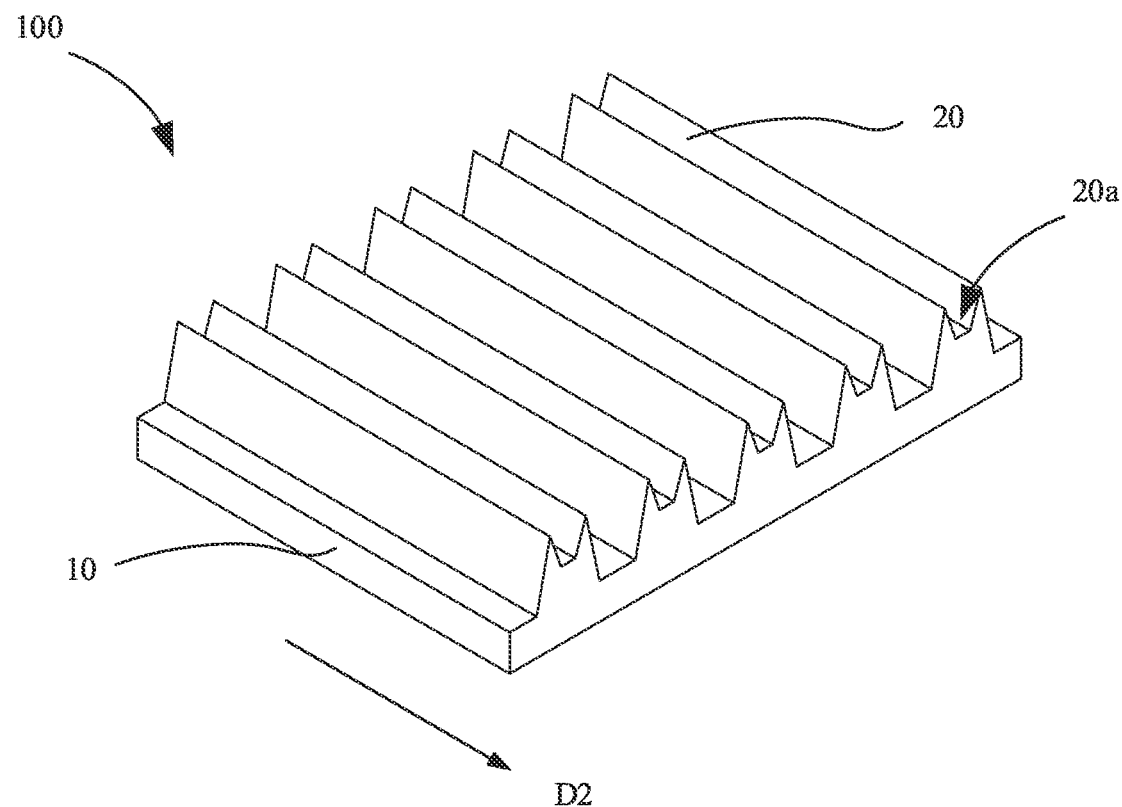
FIG. 3 is a three-dimensional schematic diagram of a substrate and protrusions of the optical film of FIG. 1.

Referring to FIG. 2 and FIG. 3, the protrusion 20 is a frustum with a recess 20a. Specifically, the protrusion 20 is the frustum, an upper surface of the frustum is provided with the recess 20a with an inverted trapezoidal cross-section, and the recess 20a removes an entire top surface of the frustum. Alternatively, the recess 20a extends from the extension direction of the protrusions 20, that is, one end of the second direction D2 to the other end, and extends through the entire protrusion 20. The protrusion 20 has a light incident surface 201. The light incident surface 201 is a surface where light enters the protrusion 20 from the substrate 10. The light incident surface 201 is parallel to the surface 10a of the substrate. On a side of the protrusions 20 away from the substrate 10, a plurality of light-emitting surfaces are provided. The plurality of light-emitting surfaces include a center plane 21, a first inclined surface 22, a second inclined surface 23, a third inclined surface 24, and a fourth inclined surface 25. The protrusion 20 has a symmetrical structure and has a symmetry plane O. The center plane 21 is disposed in a center of the protrusion 20 and is symmetrical with respect to the symmetry plane O. The third inclined surface 24 is symmetrical to the first inclined surface 22 with respect to the symmetry plane O, and the fourth inclined surface 25 is symmetrical to the second inclined surface 23 with respect to the symmetry plane O. By setting the protrusion 20 as the symmetrical structure, the light emitted from both sides can be made uniform, a display quality can be improved, and a manufacturing difficulty can be greatly reduced.

It can be understood that the protrusion 20 may also has an asymmetric structure, that is, the third inclined surface 24 is not symmetrical to the first inclined surface 22 with respect to the symmetry plane 0, and the fourth inclined surface 25 is not symmetrical to the second inclined surface 23 with respect to the symmetry plane 0.

The center plane 21 is parallel to the surface 10a of the substrate. The first inclined surface 22 is connected between the center plane 21 and the second inclined surface 23. The second inclined surface 23 is disposed on a side of the first inclined surface 22 away from the center plane 21. The second inclined surface 23 is connected between the first inclined surface 22 and the surface 10a of the substrate. The first inclined surface 22 is inclined with respect to the surface 10a of the substrate, and the first inclined surface 22 is configured to refract light so that the light travels in a direction close to the center of the protrusion 20. The first inclined surface 22 extends away from the surface 10a of the substrate in the direction away from the center plane 21. The first inclined surface 22 is connected to one side of the center plane 21, and is disposed on a side of the center plane 21 away from the substrate 10. A first angle α is formed between an extended surface of the first inclined surface 22 and the surface 10a of the substrate, and the first angle α is an acute angle. The second inclined surface 23 is inclined with respect to the surface 10a of the substrate. The second inclined surface 23 is configured to refract light so that it travels in a direction away from the center of the protrusion 20. The second inclined surface 23 approaches the surface 10a of the substrate in the direction away from the center plane 21. The second inclined surface 23 is connected to an edge of the first inclined surface 22 away from the center plane 21. An angle is formed between the second inclined surface 23 and the first inclined surface 22. The second inclined surface 23 and the first inclined surface 22 are inclined in opposite directions. That is, the first inclined surface 22 is inclined to a first side in a vertical direction, and the second inclined surface 23 is inclined to a second side opposite to the first side in the vertical direction. Alternatively, the first side is a left side, and the second side is a right side. A second angle θ is formed between the second inclined surface 23 and the substrate surface 10a, and the second angle β is an obtuse angle. It should be noted that, in this specification, the angles formed with the surface 10a of the substrate all refer to the angles formed with the first direction D1 of the surface 10a of the substrate.

Similarly, the third inclined surface 24 is connected to one side of the center plane 21, and is disposed on a side of the center plane 21 away from the substrate 10. The third inclined surface 24 is connected between the center plane 21 and the fourth inclined surface 25. The fourth inclined surface 25 is connected between the third inclined surface 24 and the surface 10a of the substrate. The fourth inclined surface 25 is disposed on a side of the third inclined surface 24 away from the center plane 21. The third inclined surface 24 is inclined with respect to the surface 10a of the substrate, and the third inclined surface 24 is configured to refract light so that the light travels in a direction close to the center of the protrusion 20. The third inclined surface 24 extends away from the surface 10a of the substrate in the direction away from the center plane 21. An obtuse angle is formed between an extended surface of the third inclined surface 24 and the surface 10a of the substrate. The fourth inclined surface 25 is inclined with respect to the surface 10a of the substrate, and the fourth inclined surface 25 is configured to refract light so that it travels in a direction away from the center of the protrusion 20. The fourth inclined surface 25 approaches the surface 10a of the substrate in the direction away from the center plane 21. The fourth inclined surface 25 is connected to an edge of the third inclined surface 24 away from the center plane 21. An angle is formed between the fourth inclined surface 25 and the third inclined surface 24. The fourth inclined surface 25 and the third inclined surface 24 are inclined in opposite directions. That is, the third inclined surface 24 is inclined to the second side in the vertical direction, and the fourth inclined surface 25 is inclined to the first side in the vertical direction. The first side is the left side, and the second side is the right side. An acute angle is firmed between the fourth inclined surface and the surface 10a of the substrate.

In short, a bottom surface of the recess 20a is the center plane 21. Two opposite side surfaces of the recess 20a are the first inclined surface 22 and the third inclined surface 24. Two outer side surfaces of protrusion 20 are the second inclined surface 23 and the fourth inclined surface 25. The center plane 21, the first inclined surface 22, the second inclined surface 23, the third inclined surface 24, and the fourth inclined surface 25 may all be planes, or may be planes provided with microstructures.

Figure 4:
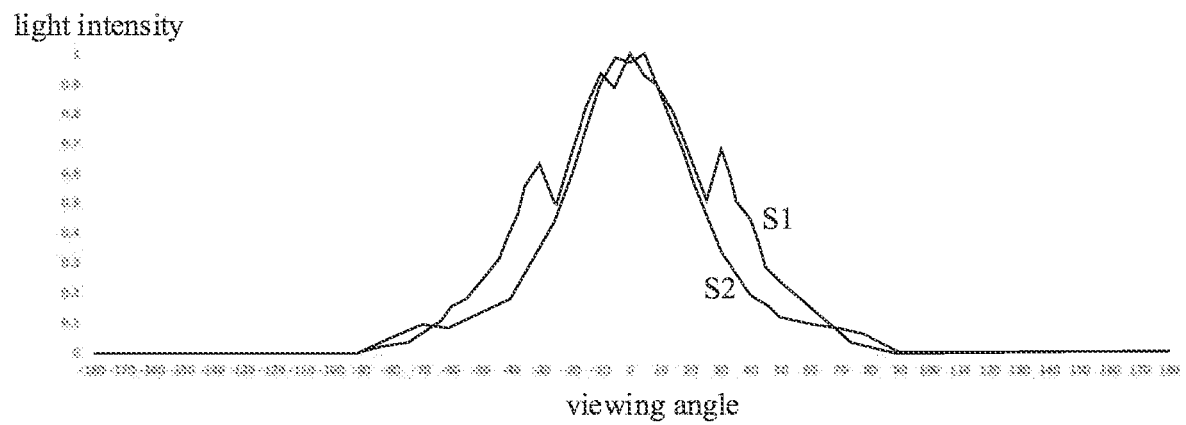
FIG. 4 is a comparison diagram showing light intensity of an optical film of the prior art and the optical film of the present disclosure as viewing angle changes.
Figure 5:
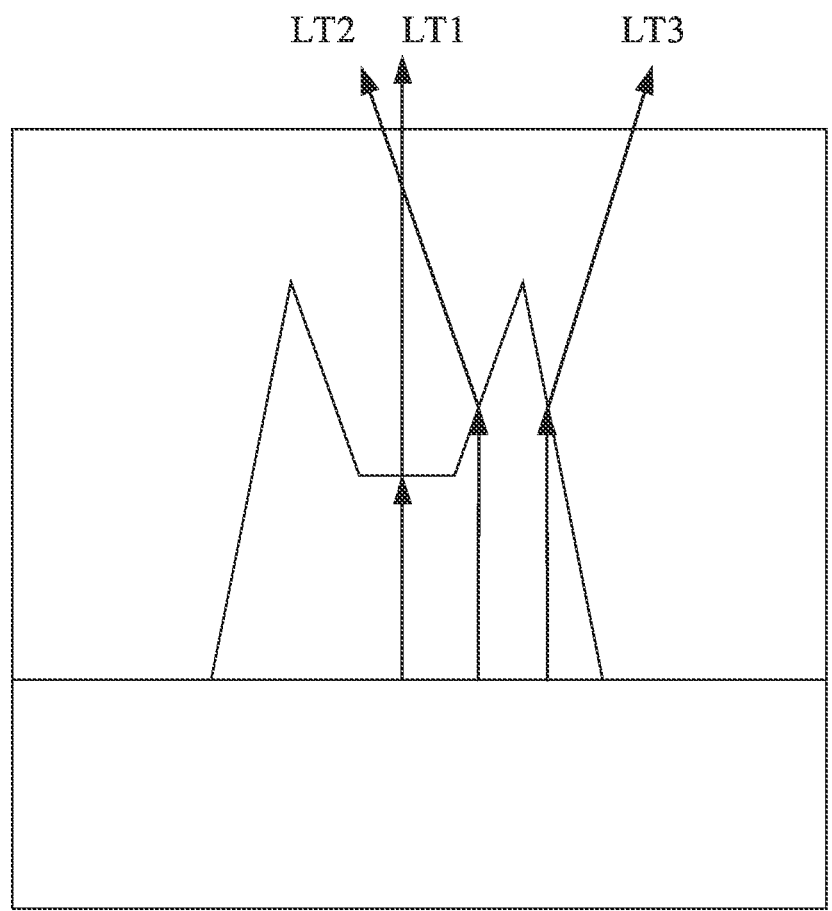
FIG. 5 is a diagram showing a light path when light passes through one of the protrusions of FIG. 2.
Figure 6:
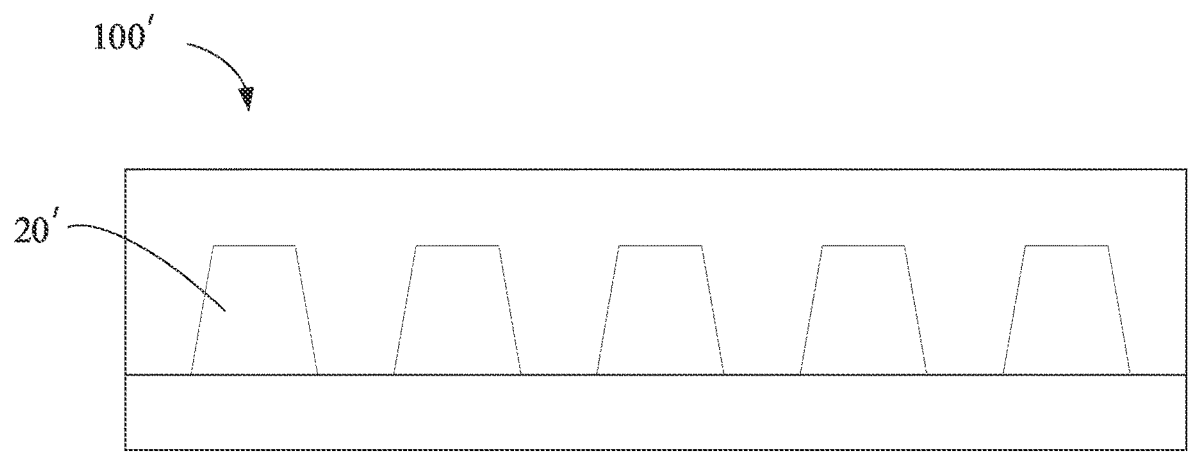
FIG. 6 is a cross-sectional view of an optical film in the prior art.

Referring to FIG. 4 and FIG. 5, inventors conducted a comparison test of light intensity under different viewing angles on an optical film 100' of the prior art and the optical film 100 of this embodiment under the same conditions. A curve S1 represents a curve of the light intensity of the optical film 100 of the present disclosure as viewing angle changes. A curve S2 represents a curve of the light intensity of the optical film 100' of the prior art as viewing angle changes. The viewing angle shown in this specification refers to: the viewing angle at the symmetry plane 0 is a positive viewing angle, that is, 0 degrees. As it moves away from the symmetry plane 0, the viewing angle gradually increases, the viewing angle on the left side of the symmetry plane 0 is a negative viewing angle, and the viewing angle on the right side of the symmetry plane 0 is a positive viewing angle. Referring to FIG. 6, a difference between the optical film 100' of the prior art and the optical film 100 of the present disclosure is: protrusions 20' are regular frustums, and there is no recess on the frustums. In FIG. 4, an abscissa represents the viewing angles, a unit is degrees, and an ordinate represents the light intensity, a unit is 1. A working principle of the optical film 100 analyzed in this embodiment is as follows.

When the optical film 100 of the present disclosure is disposed on a light source (not shown), light enters the protrusion 20 from the light incident surface 201, and the protrusion 20 can take the center plane 21 as a light splitting center to achieve a light splitting effect. Specifically, the center plane 21 is configured to control an emission of light LT1 in a first viewing angle range. When the light is emitted from the center plane 21, it emits perpendicular to the center plane 21. The first inclined surface 22 is configured to control an emission of light LT2 in a second viewing angle range. When the light is emitted from the first inclined surface 22, the light is emitted in a direction close to a center of the protrusion 20. The second inclined surface 23 is configured to control an emission of light LT3 in a third viewing angle range. When the light is emitted from the second inclined surface 23, the light is emitted in a direction away from the center of the protrusion 20. When the light is emitted from the protrusion 20, the symmetry plane 0 of the center plane 21 is regarded as 0 degrees in a front view, and the viewing angle of the symmetry plane 0 of the center plane 21 increases as it moves away from the center plane 21. The center plane 21, the first inclined surface 22, and the third inclined surface 24 are directly connected, and the corresponding viewing angle ranges are three consecutive viewing angle ranges. That is, the first viewing angle range, the second viewing angle range, and the third viewing angle range are three consecutive viewing angle ranges. That is, a maximum value of the first viewing angle range is equal to a minimum value of the second viewing angle range, and a maximum value of the second viewing angle range is equal to a minimum value of the third viewing angle range. In FIG. 4, the first viewing angle range is −10 degrees to 10 degrees, the second viewing angle range is 10 degrees to 30 degrees, and the third viewing angle range is 30 degrees to 70 degrees. The third inclined surface 24, which is symmetrical to the first inclined surface 22, is configured to control the light in a viewing angle range of −10 degrees to −30 degrees. The fourth inclined surface 25, which is symmetrical to the second inclined surface 23, is configured to control the light in a viewing angle range of −30 degrees to −70 degrees. According to a comparison result of the curve S1 and the curve S2, the optical film 100 of the present disclosure has different light intensity in the viewing angle range of −10 degrees to 10 degrees, −20 degrees to −90 degrees, and 20 degrees to 90 degrees from the prior art. That is, the optical film 100 of the present disclosure can be configured to finely control the light emission in different viewing angle ranges. It can be understood that by adding more planes to the protrusion 20 of the optical film 100, the first inclined surface and the second inclined surface can further finely control the light emission. A large number of experiments have proved that the optical film 100 of the present disclosure can adjust the light in the range of 5 degrees. In addition, after the light is adjusted by the optical film 100 of the present disclosure, the light intensity at a viewing angle ranging from 30 degrees to 70 degrees is significantly increased, which improves a light extraction rate. Furthermore, the uniformity of the light emission is improved.

After further research, inventors found that when other parameters are fixed, a length of the center plane 21 in the first direction D1 can determine a size of the first viewing angle range and the light intensity. Specifically, the longer the length of the center plane 21 in the first direction D1, the more light emitted from the center plane 21, the greater the maximum value of the first viewing angle range, and the stronger the emitted light at the first viewing angle range. That is, view angle characteristics from small angles become better. A length of the first inclined surface 22 in the first direction D1 and the first angle α together determine a size of the second viewing angle range and the light intensity. Specifically, the greater the length of the first inclined surface 22 in the first direction D1 and the greater the first angle α, the more light emitted from the first inclined surface 22, the greater the maximum value of the second viewing angle range, and the stronger the emitted light at the second viewing angle range. That is, view angle characteristics from medium angles become better. Moreover, the two can be coordinated to adjust to achieve a more refined light control effect. The length of the second inclined surface 23 in the first direction D1 and the second angle β together determine a size of the third viewing angle range and the light intensity. Specifically, the greater the length of the second inclined surface 23 in the first direction D1 and the greater the second angle β, the more light emitted from the second inclined surface 23, the greater the maximum value of the third viewing angle range, and the stronger the emitted light at the third viewing angle range. That is, view angle characteristics from large angles become better.

Figure 7:
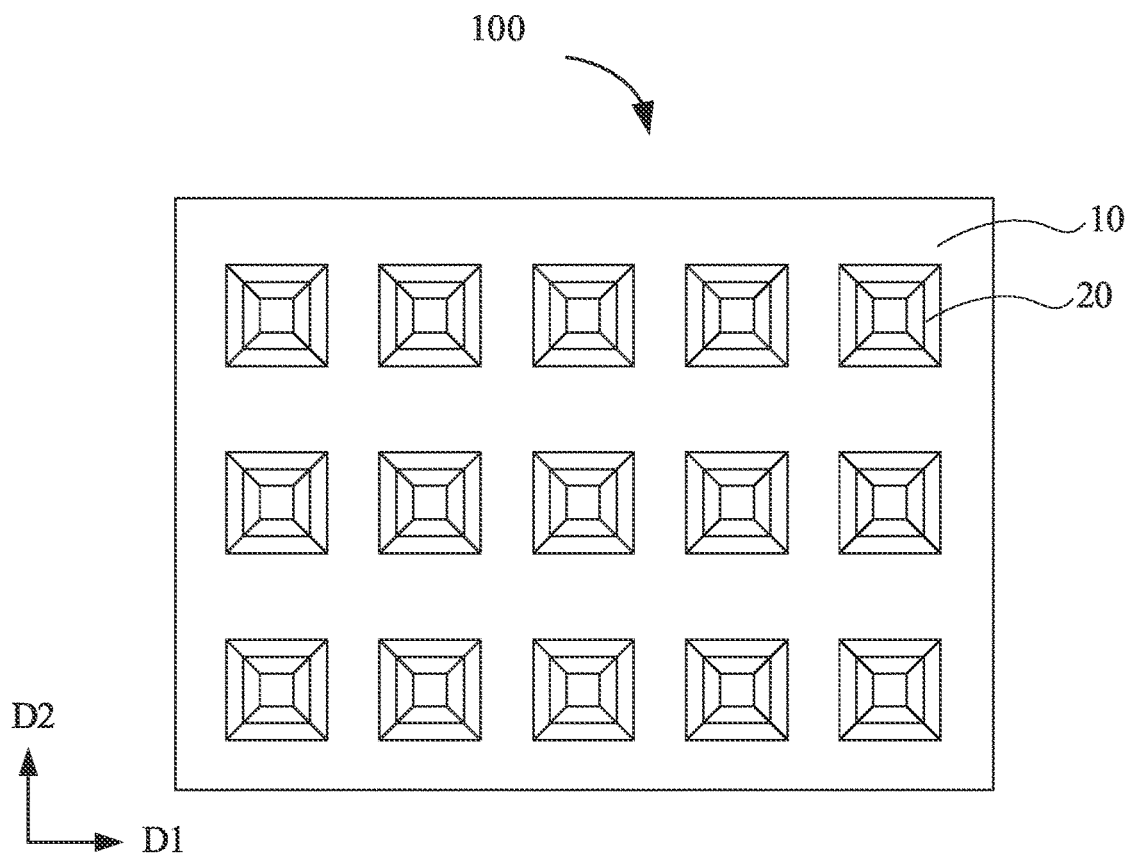
FIG. 7 is a top view of an optical film of a second embodiment of the present disclosure.
Figure 8:
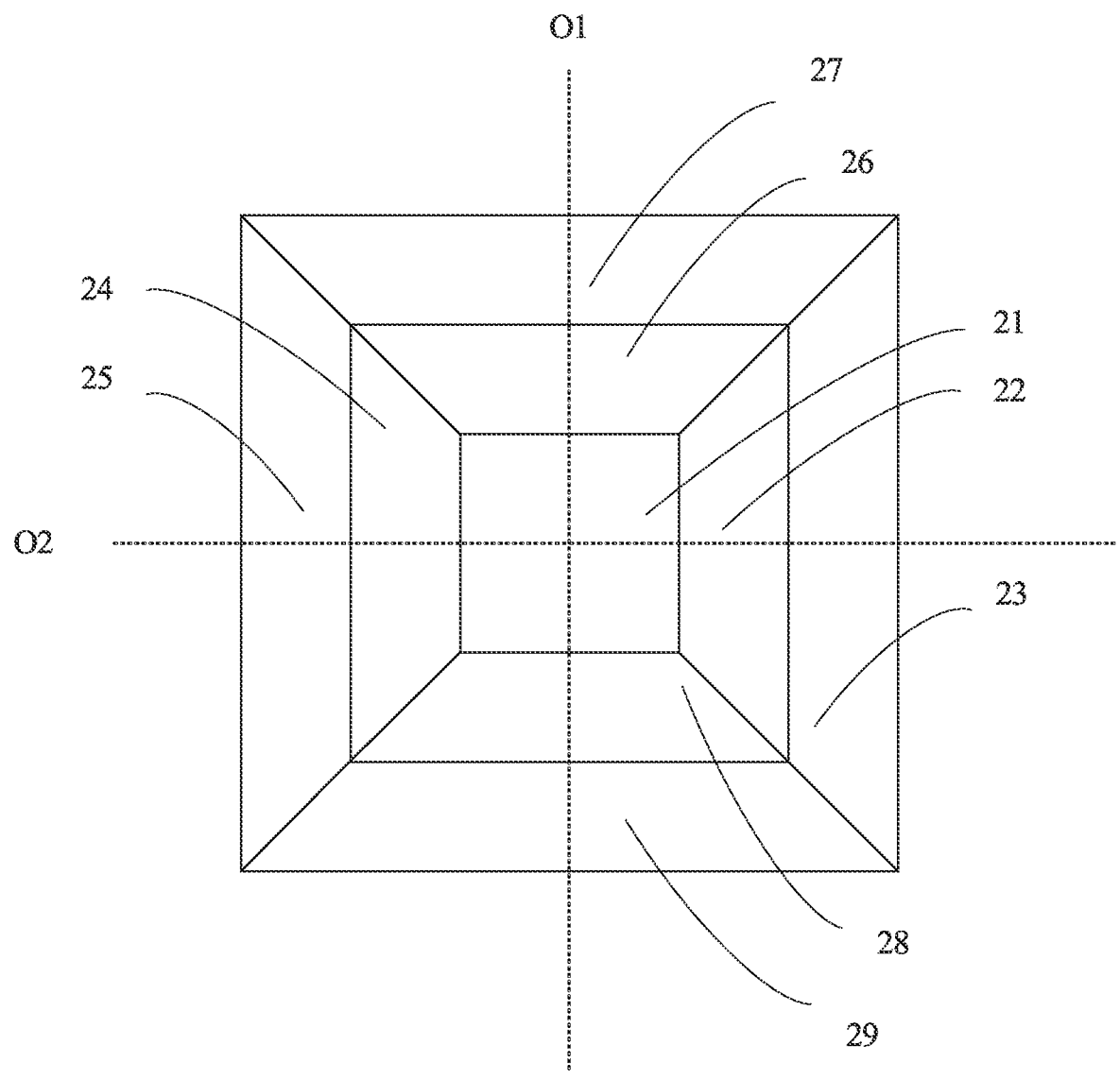
FIG. 8 is a top view of a protrusion of the optical film of FIG. 7.
Figure 9:
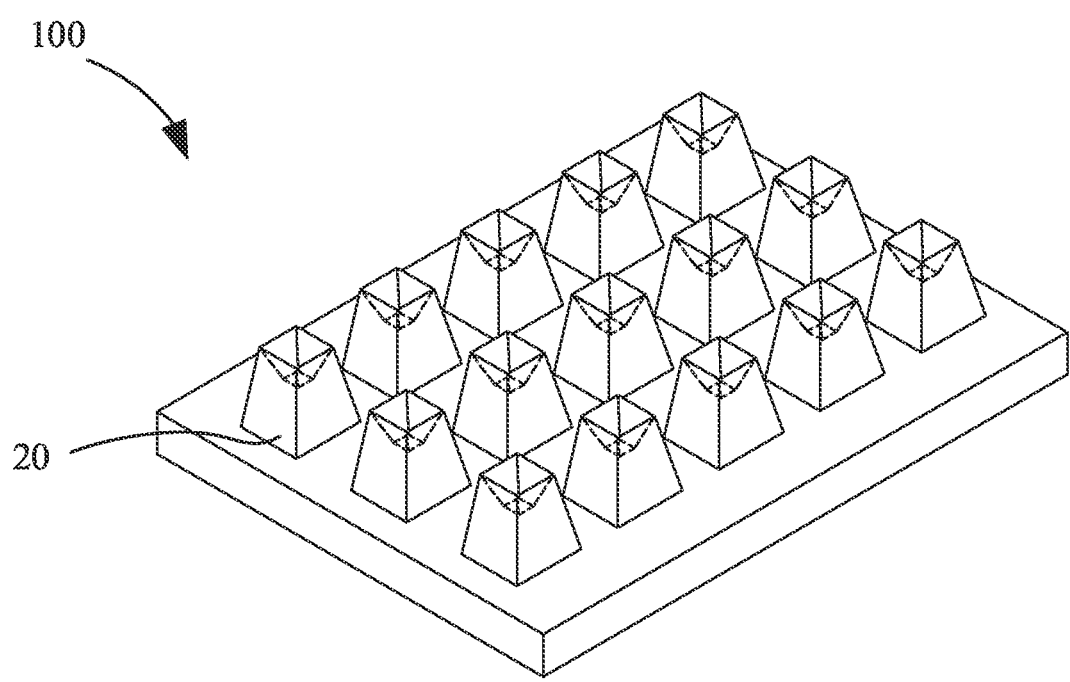
FIG. 9 is a three-dimensional schematic diagram of a substrate and protrusions of the optical film of FIG. 7.

In the first embodiment, it is shown that the protrusion 20 is provided with inclined surfaces in the first direction D1 for light splitting. Referring to FIG. 7 to FIG. 9, a second embodiment of the present disclosure shows that a protrusion 20 is also provided with inclined surfaces in the second direction D2 for light splitting.

Specifically, the protrusion 20 includes a first symmetry plane O1 and a second symmetry plane O2, and the first symmetry plane O1 and the second symmetry plane O2 are perpendicular to each other. It should be noted that cross-sectional diagrams along the first symmetry plane O1 and the second symmetry plane O2 of the second embodiment can refer to FIG. 2 and are omitted here. A center plane 21 is symmetrical with respect to the first symmetry plane O1 and the second symmetry plane O2. The third inclined surface 24 is symmetrical to the first inclined surface 22 with respect to the first symmetry plane O1. The fourth inclined surface 25 is symmetrical to the second inclined surface 23 with respect to the first symmetry plane O1. In addition, the protrusion also include a fifth inclined surface 26, a sixth inclined surface 27, a seventh inclined surface 28, and an eighth inclined surface 29.

The fifth inclined surface 26 is connected to the center plane 21, and is connected between the first inclined surface 22 and the third inclined surface 24. The fifth inclined surface 26 is inclined with respect to the surface 10a of the substrate, and the fifth inclined surface 26 is configured to refract light so that it travels in a direction close to a center of the protrusion 20. The fifth inclined surface 26 extends away from the surface of the substrate 10 in a direction away from the center plane 21. The sixth inclined surface 27 is connected between the fifth inclined surface 26 and the surface of the substrate 10, and is connected between the second inclined surface 23 and the fourth inclined surface 25. The sixth inclined surface 27 is disposed on a side of the fifth inclined surface 26 away from the center plane 21. The sixth inclined surface 27 is inclined with respect to the surface 10a of the substrate, and the sixth inclined surface 27 is configured to refract light so that it travels in a direction away from the center of the protrusion 20. The sixth inclined surface 27 approaches the surface 10a of the substrate in the direction away from the center plane 21. The seventh inclined surface 28 is symmetrical to the fifth inclined surface 26 with respect to the second symmetry plane O2. The eighth inclined surface 29 is symmetrical to the sixth inclined surface 27 with respect to the second symmetry plane O2. Specifically, the seventh inclined surface 28 is connected to the center plane 21, and is connected between the first inclined surface 22 and the third inclined surface 24. The seventh inclined surface 28 extends away from the surface of the substrate 10 in the direction away from the center plane 21. The eighth inclined surface 29 is connected between the seventh inclined surface 28 and the surface of the substrate 10, and is connected between the second inclined surface 23 and the fourth inclined surface 25. The eighth inclined surface 29 is disposed on a side of the seventh inclined surface 28 away from the center plane 21. The eighth inclined surface 29 approaches the surface of the substrate 10 in the direction away from the center plane 21. That is, a recess 20a of the protrusion 20 is a frustum, and the recess 20a is formed on protrusion 20, but does not extend through any side surface of protrusion 20. In addition, a plurality of protrusions 20 are arranged in an array on the substrate 10. That is, the plurality of protrusions 20 are arranged at intervals in the first direction D1, and also arranged at intervals in the second direction D2 perpendicular to the first direction D1.

Figure 10:
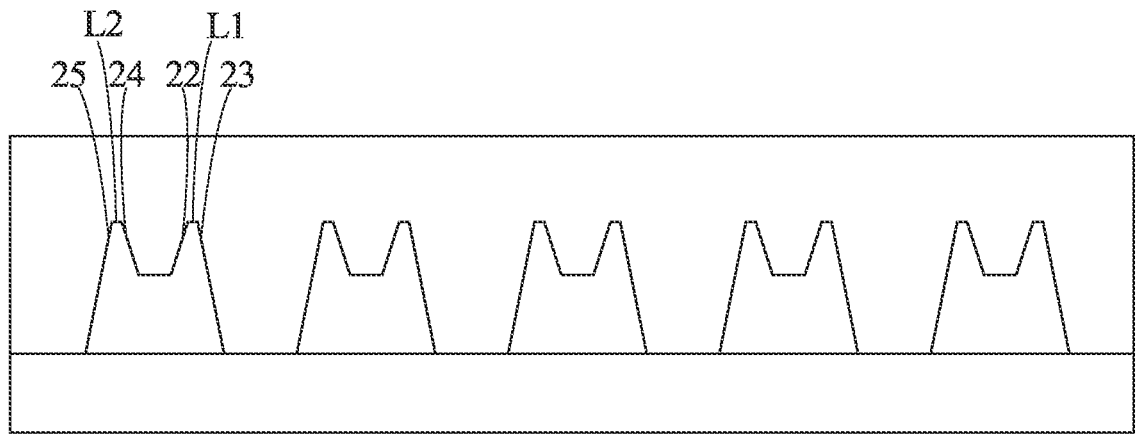
FIG. 10 is a cross-sectional view of an optical film of a third embodiment of the present disclosure.
Figure 11:
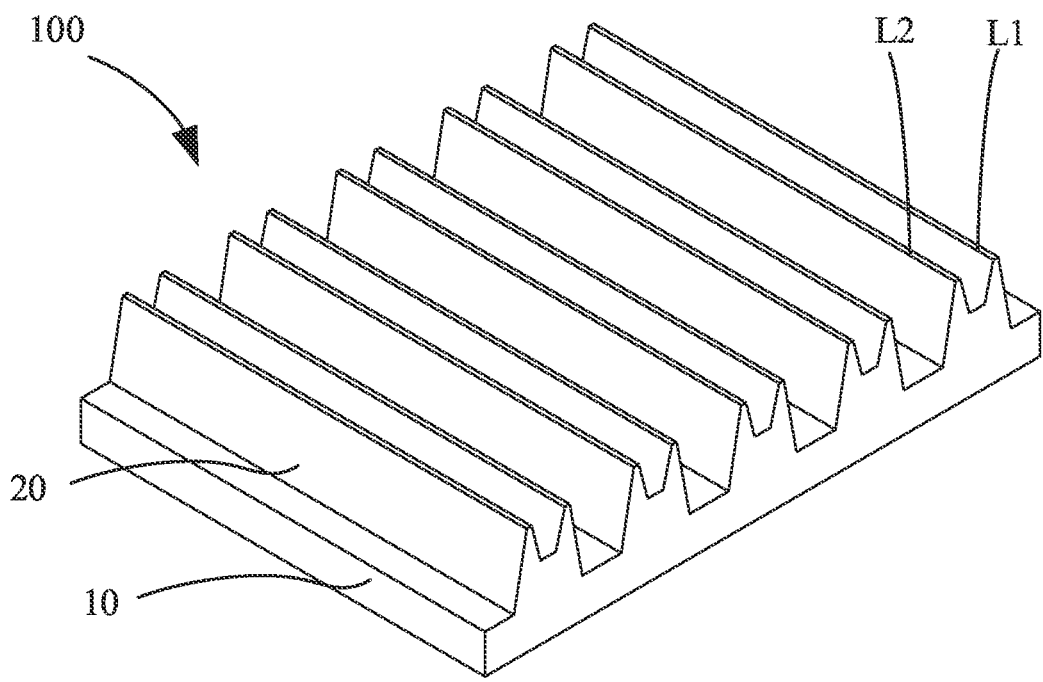
FIG. 11 is a three-dimensional schematic diagram of a substrate and protrusions of the optical film of FIG. 10.
Figure 12:
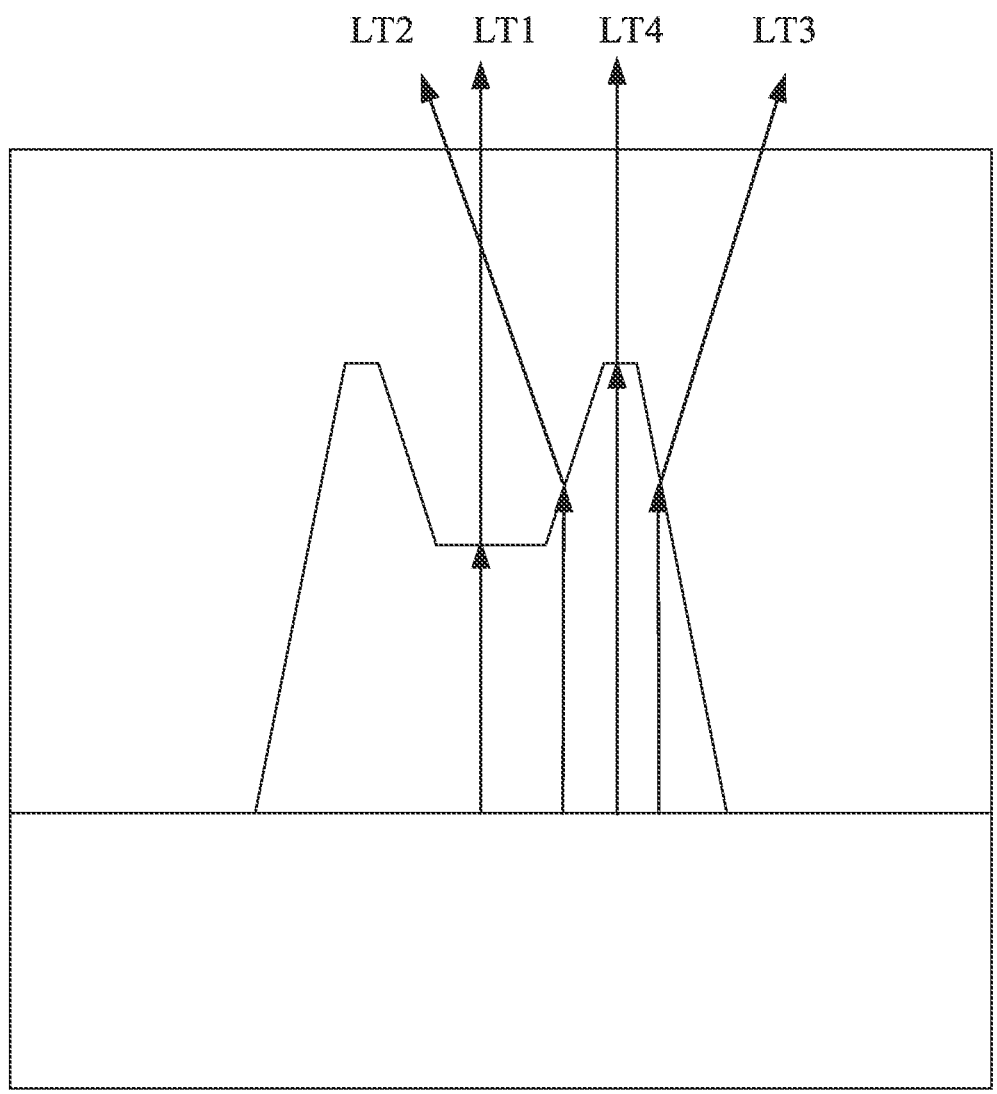
FIG. 12 is a diagram showing a light path when light passes through one of the protrusions of FIG. 10.

Referring to FIG. 10 to FIG. 12, a difference between an optical film 100 of a third embodiment of the present disclosure and the optical film 100 of the first embodiment is as follows.

The protrusion 20 also includes a first connection surface L1. The first connection surface L1 is connected between the first inclined surface 22 and the second inclined surface 23. The first connection surface L1 is parallel to the surface 10a of the substrate. Correspondingly, the protrusion 20 also includes a second connection surface L2 connected between the third inclined surface 24 and the fourth inclined surface 25. Referring to FIG. 4, in the first embodiment, there are light intensity collapses between −20 degrees to −40 degrees and 20 degrees to 40 degrees, that is, areas where the light intensity is weaker. Through analysis, inventors conclude that a reason is that the first inclined surface 22 refracts the light LT2 in the second viewing angle range to a region close to the center of the protrusion 20, and the second inclined surface 23 refracts the light LT3 in the third viewing range to a region far away from the center of the protrusions 20. Thus, the light at an intersection of the first inclined surface 22 and the second inclined surface 23 are emitted sideways, and the light emitted from the front side is reduced, causing the light intensity to collapse. In this embodiment, the first connection surface L1 parallel to the substrate surface 10a is formed between the first inclined surface 22 and the second inclined surface 23, and the second connection surface L2 parallel to the substrate surface 10a is formed between the third inclined surface 24 and the fourth inclined surface 25. As shown in FIG. 12, the first connection surface L1 is configured to control an emission of light LT4 in a fourth viewing angle range. When the light is emitted from the first connection surface L1, it is emitted perpendicular to the first connection surface L1, that is, emitted from the front, thereby compensating for the collapse of the light intensity of 20 degrees to 40 degrees. Similarly, the second connection surface L2 compensates for the collapse of light intensity from −20 degrees to −40 degrees.

Figure 13:
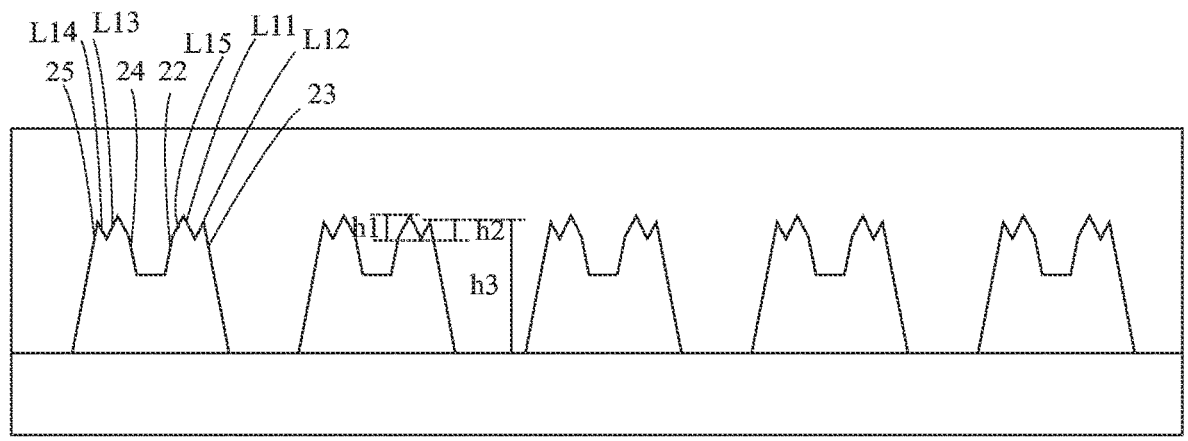
FIG. 13 is a cross-sectional view of an optical film of a fourth embodiment of the present disclosure.
Figure 14:
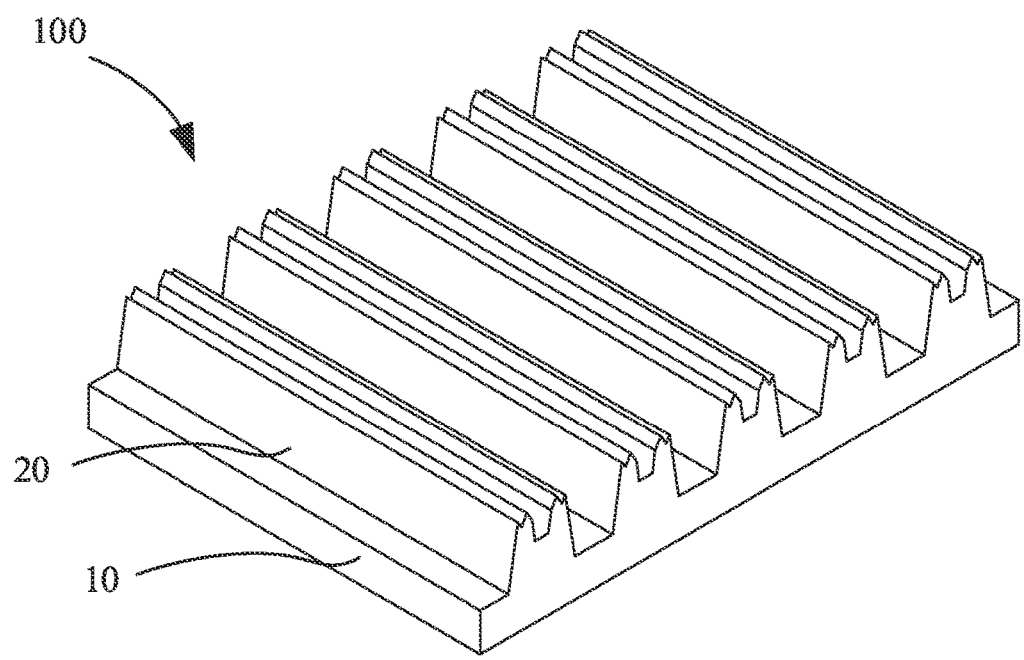
FIG. 14 is a three-dimensional schematic diagram of a substrate and protrusions of the optical film of FIG. 13.

Referring to FIG. 13 and FIG. 14, in an optical film 100 of a fourth embodiment of the present disclosure, the protrusion 20 include a first sub-connection surface L11 and a second sub-connection surface L12. The first sub-connection surface L11 and the second sub-connection surface L12 are connected between the first inclined surface 22 and the second inclined surface 23. The first sub-connection surface L11 is connected between the first inclined surface 22 and the second sub-connection surface L12. The first sub-connection surface L11 is inclined with respect to the surface 10a of the substrate, and the first sub-connection surface L11 is configured to refract light so that it travels in a direction away from the center of the protrusion 20. The first sub-connection surface L11 extends away from the surface 10a of the substrate in the direction away from the center plane 21. The second sub-connection surface L12 is connected between the first sub-connection surface L11 and the second inclined surface 23. The second sub-connection surface L12 is inclined with respect to the substrate surface 10a. The second sub-connection surface L12 is configured to refract light so that it travels in a direction close to the center of the protrusion 20. The second sub-connection surface L12 is close to the surface 10a of the substrate in the direction away from the center plane 21. Furthermore, the first sub-connection surface L11 and the second sub-connection surface L12 are microstructures formed between the first inclined surface 22 and the second inclined surface 23. A length h1 of the first sub-connection surface L11 in the direction perpendicular to the surface 10a of the substrate and a length h2 of the second sub-connection surface L12 in the direction perpendicular to the surface 10a of the substrate are both less than a length h3 of the second inclined surface 23 in the direction perpendicular to the surface 10a of the substrate. Alternatively, the length h1 of the first sub-connection surface L11 in the direction perpendicular to the surface 10a of the substrate and the length h2 of the second sub-connection surface L12 in the direction perpendicular to the surface 10a of the substrate are in a range of one-third to one-half of the length h3 of the second inclined surface 23 in the direction perpendicular to the surface 10a of the substrate. Thus, it is possible to compensate for this part of the light intensity collapse. Similarly, on the other side symmetrical to the first sub-connection surface L11 and the second sub-connection surface L12, the protrusion 20 further includes a third sub-connection surface L13 and a fourth sub-connection surface L14. The third sub-connection surface L13 and the fourth sub-connection surface L14 are connected between the third inclined surface 24 and the fourth inclined surface 25. The third sub-connection surface L13 is connected between the third inclined surface 24 and the fourth sub-connection surface L14. Since the protrusion 20 of this embodiment is a symmetric structure, structures of the third sub-connection surface L13 and the fourth sub-connection surface L14 can refer to the first sub-connection surface L11 and the second sub-connection surface L12, and the description is omitted here. In addition, more sub-connection surfaces can be provided for finer control. For example, as shown in the drawing, a fifth sub-connection surface L15 can also be provided between the first sub-connection surface L11 and the first inclined surface 22.

Figure 15:
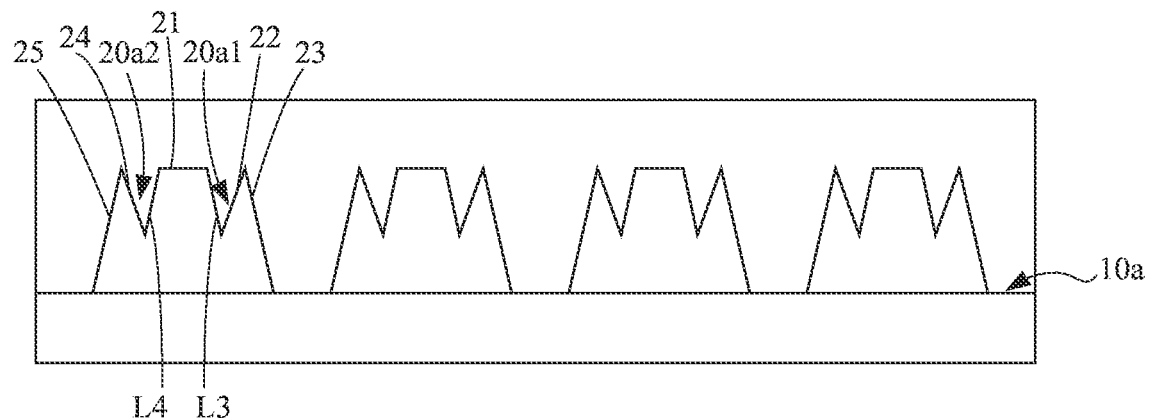
FIG. 15 is a cross-sectional view of an optical film of a fifth embodiment of the present disclosure.

Referring to FIG. 15, a difference between an optical film 100 of a fifth embodiment of the present disclosure and the optical film 100 of the first embodiment is as follows.

The center plane 21 is a top surface of the protrusion 20. The protrusion 20 is provided with a first recess 20a1 and a second recess 20a2. The first recess 20a1 and the second recess 20a2 are disposed on both sides of the center plane 21, respectively. The first recess 20a1 and the second recess 20a2 are both disposed on a side of the center plane 21 close to the surface 10a of the substrate. A side wall of the first recess 20a forms the first inclined surface 22. There is also a third connection surface L3 between the center plane 21 and the first inclined surface 22. The third connection surface L3 is inclined with respect to the surface 10a of the substrate, and an inclination direction thereof is opposite to the first inclined surface 22. The third connection surface L3 can refract the light so that it travels in a direction away from the center of the protrusion 20. Similarly, a side wall of the second recess 20a2 forms the third inclined surface 24. There is also a fourth connection surface L4 between the center plane 21 and the fourth inclined surface 25. The fourth connection surface L4 is inclined with respect to the surface 10a of the substrate, and its inclination direction is opposite to the third inclined surface 24. The fourth connection surface L4 can refract the light so that it travels in a direction away from the center of the protrusion 20. In this embodiment, shapes of the first recess 20a1 and the second recess 20a2 are triangular prisms. However, in other embodiments, the first recess 20a1 and the second recess 20a1 may also have other shapes, such as a frustum.

The present disclosure also provides a display device. The display device includes a display panel and the optical film in the embodiment of the present disclosure. The optical film is disposed on a light-emitting side of the display panel. Specifically, the display device may be a liquid crystal display device or an organic light-emitting diode display device.

Figure 16:
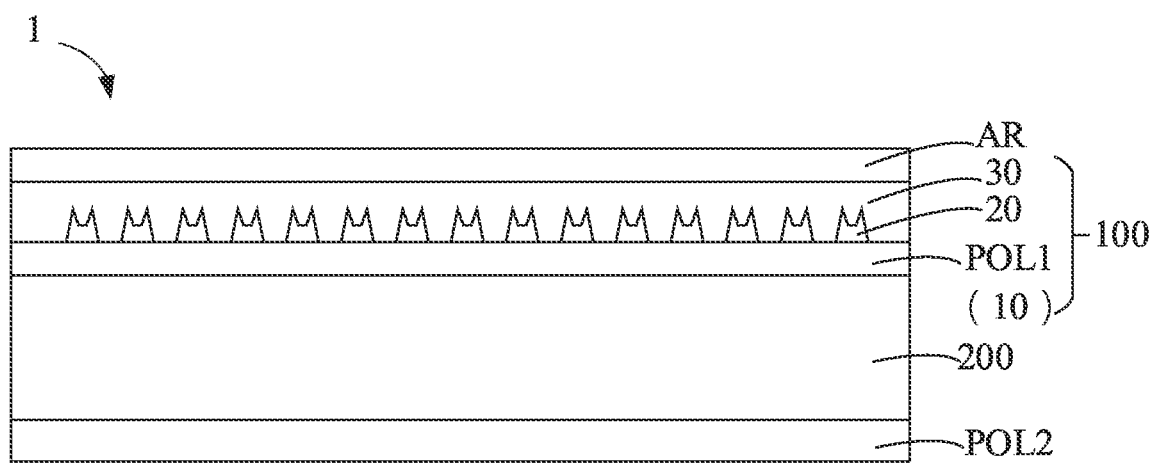
FIG. 16 is a partial cross-sectional view of a structure of a display device of the present disclosure.

Referring to FIG. 16, the display device 1 shown in FIG. 16 is a liquid crystal display device. The display device 1 includes a display panel 200 and an optical film 100 disposed on a light-emitting side of the display panel 200. Specifically, the display panel 200 is a liquid crystal display panel, which includes an array substrate, a color filter substrate, and a liquid crystal layer disposed between the array substrate and the color filter substrate. The display device 1 includes an upper polarizer POL1 disposed on the light-emitting side and a lower polarizer POL2 disposed on a light-incident side of the display panel 200. In this embodiment, the upper polarizer POL1 of the liquid crystal display device 1 can serve as the substrate 10 of the optical film 100. The upper polarizer POL1 is provided with protrusions 20, and a planarization layer 30 covers the protrusions 20. An anti-reflection film AR is also disposed on the light-emitting side of the optical film 100. The optical film 100 and anti-reflection film AR together can achieve a better adjustment performance. In this embodiment, a roll-to-roll process can be used to form the protrusions 20 on a substrate material. However, the forming process is not limited to the roll-to-roll process, and other thermoplastic forming processes can also be used.

Figure 17:
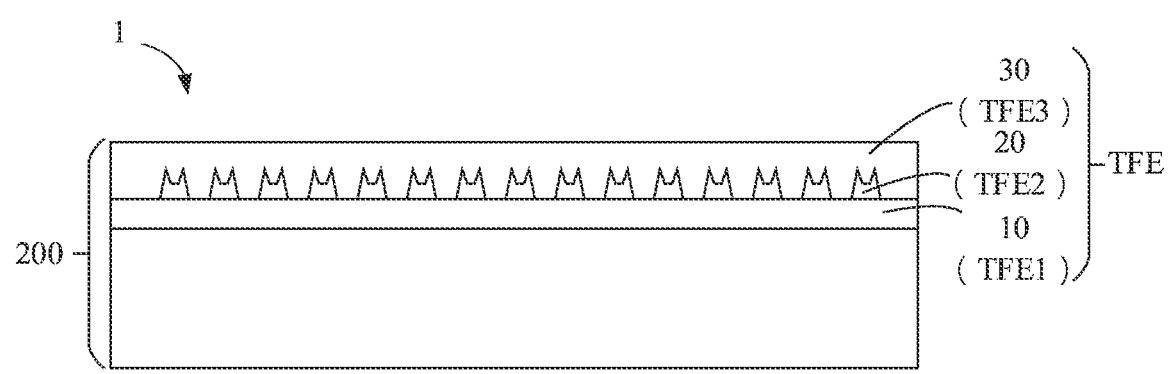
FIG. 17 is a partial cross-sectional view of another structure of a display device of the present disclosure.

Referring to FIG. 17, a display device 1 shown in FIG. 17 is an organic light emitting diode display device. The display device 1 includes a display panel 200. The display panel 200 may be an organic light-emitting diode display panel, which includes an array substrate, an OLED light emitting device disposed on the array substrate, and a thin film encapsulation layer TFE. The thin film encapsulation layer TFE includes a first encapsulation layer TFE1, a second encapsulation layer TFE2 disposed on the first encapsulation layer TFE1, and a third encapsulation layer TFE3 disposed on the second encapsulation layer TFE2. The substrate 10 of the optical film 100 is the first encapsulation layer TFE1, the protrusions 20 are the second encapsulation layer TFE2, and the planarization layer 30 is the third encapsulation layer TFE3. The protrusions 20 can be directly made of encapsulating material using a photolithography process.

According to the optical film of the present disclosure, the light emission in different viewing angle ranges can be finely controlled. In addition, after the light is controlled by the optical film of the present disclosure, the light intensity in the second viewing angle range and the third viewing angle range is significantly increased, which improves the light extraction rate. Furthermore, the uniformity of the light emission is improved.

The implementations of the present disclosure have been described in detail, and specific examples are used herein to illustrate the principle and embodiments of the present disclosure, which are only used to help understand the present disclosure. For those skilled in the art, based on the idea of the present disclosure, there will be changes in the specific implementation and the scope of application. Accordingly, the content of this specification should not be construed as a limitation on the present disclosure.

What is claimed is:

1. An optical film, comprising: a substrate and a plurality of protrusions disposed on a surface of the substrate, wherein each of the protrusions comprises:
   a center plane parallel to the surface of the substrate;
   a first inclined surface connected to the center plane, wherein the first inclined surface extends away from the surface of the substrate in a direction away from the center plane; and
   a second inclined surface connected between the first inclined surface and the surface of the substrate, wherein the second inclined surface is disposed on a side of the first inclined surface away from the center plane, and the second inclined surface approaches the surface of the substrate in the direction away from the center plane,
   wherein each of the protrusions further comprises a first connection surface, the first connection surface is connected between the first inclined surface and the second inclined surface, and the first connection surface is parallel to the surface of the substrate, or
   wherein each of the protrusions further comprises a first sub-connection surface and a second sub-connection surface, and the first sub-connection surface and the second sub-connection surface are connected between the first inclined surface and the second inclined surface, the first sub-connection surface is connected between the first inclined surface and the second sub-connection surface, the first sub-connection surface is inclined with respect to the surface of the substrate, and the first sub-connection surface extends away from the surface of the substrate in the direction away from the center plane; and the second sub-connection surface is connected between the first sub-connection surface and the second inclined surface, the second sub-connection surface is inclined with respect to the surface of the substrate, and the second sub-connection surface is close to the surface of the substrate in the direction away from the center plane.

2. The optical film according to claim 1, wherein each of the protrusions further comprises a third inclined surface and a fourth inclined surface;
   the third inclined surface is connected to the center plane, and the third inclined surface extends away from the surface of the substrate in the direction away from the center plane; and
   the fourth inclined surface is connected between the third inclined surface and the surface of the substrate, and the fourth inclined surface is disposed on a side of the third inclined surface away from the center plane, and the fourth inclined surface approaches the surface of the substrate in the direction away from the center plane.

3. The optical film according to claim 2, wherein each of the protrusions comprises a symmetry plane, the center plane is symmetrical with respect to the symmetry plane, the third inclined surface is symmetrical to the first inclined surface with respect to the symmetry plane, and the fourth inclined surface is symmetrical to the second inclined surface with respect to the symmetry plane.

4. The optical film according to claim 2, wherein each of the protrusions further comprises:
   a fifth inclined surface connected to the center plane, and connected between the first inclined surface and the third inclined surface, wherein the fifth inclined surface extends away from the surface of the substrate in the direction away from the center plane;
   a sixth inclined surface connected between the fifth inclined surface and the surface of the substrate, and connected between the second inclined surface and the fourth inclined surface, wherein the sixth inclined surface is disposed on a side of the fifth inclined surface away from the center plane, and the sixth inclined surface approaches the surface of the substrate in the direction away from the center plane;

a seventh inclined surface connected to the center plane, and connected between the first inclined surface and the third inclined surface, wherein the seventh inclined surface extends away from the surface of the substrate in the direction away from the center plane; and an eighth inclined surface connected between the seventh inclined surface and the surface of the substrate, and connected between the second inclined surface and the fourth inclined surface, wherein the eighth inclined surface is disposed on a side of the seventh inclined surface away from the center plane, and the eighth inclined surface approaches the surface of the substrate in the direction away from the center plane.

5. The optical film according to claim 4, wherein each of the protrusions comprises a first symmetry plane and a second symmetry plane, the first symmetry plane is perpendicular to the second symmetry plane, the center plane is symmetrical with respect to the first symmetry plane and the second symmetry plane, the third inclined surface is symmetrical to the first inclined surface with respect to the first symmetry plane, the fourth inclined surface is symmetrical to the second inclined surface with respect to the first symmetry plane, the seventh inclined surface is symmetrical to the fifth inclined surface with respect to the second symmetry plane, and the eighth inclined surface is symmetrical to the sixth inclined surface with respect to the second symmetry plane.

6. The optical film according to claim 1, wherein each of the protrusions is a frustum with a recess, the recess is a frustum with an inverted trapezoidal cross-section, a bottom surface of the recess is the center plane, one side surface of the recess is the first inclined surface, and an outer side surface of the frustum is the second inclined surface.

7. The optical film according to claim 1, wherein each of the protrusions is a frustum with a recess, a top surface of the protrusion is the center plane, and one side wall of the recess is the first inclined surface.

8. The optical film according to claim 1, further comprising a planarization layer, wherein a refractive index of the planarization layer is greater than a refractive index of the substrate and a refractive index of the protrusion, and the refractive index of the protrusion is greater than or equal to the refractive index of the substrate.

9. A display device, comprising:
a display panel; and
an optical film disposed on a light-emitting side of the display panel, wherein the optical film comprises a substrate and a plurality of protrusions disposed on a surface of the substrate, and each of the protrusions comprises:
a center plane parallel to the surface of the substrate;
a first inclined surface connected to the center plane, wherein the first inclined surface extends away from the surface of the substrate in a direction away from the center plane; and
a second inclined surface connected between the first inclined surface and the surface of the substrate, wherein the second inclined surface is disposed on a side of the first inclined surface away from the center plane, and the second inclined surface approaches the surface of the substrate in the direction away from the center plane,
wherein each of the protrusions further comprises a first connection surface, the first connection surface is connected between the first inclined surface and the second inclined surface, and the first connection surface is parallel to the surface of the substrate, or
wherein each of the protrusions further comprises a first sub-connection surface and a second sub-connection surface, and the first sub-connection surface and the second sub-connection surface are connected between the first inclined surface and the second inclined surface, the first sub-connection surface is connected between the first inclined surface and the second sub-connection surface, the first sub-connection surface is inclined with respect to the surface of the substrate, and the first sub-connection surface extends away from the surface of the substrate in the direction away from the center plane; and the second sub-connection surface is connected between the first sub-connection surface and the second inclined surface, the second sub-connection surface is inclined with respect to the surface of the substrate, and the second sub-connection surface is close to the surface of the substrate in the direction away from the center plane.

10. The display device according to claim 9, wherein each of the protrusions further comprises a third inclined surface and a fourth inclined surface;
the third inclined surface is connected to the center plane, and the third inclined surface extends away from the surface of the substrate in the direction away from the center plane; and
the fourth inclined surface is connected between the third inclined surface and the surface of the substrate, and the fourth inclined surface is disposed on a side of the third inclined surface away from the center plane, and the fourth inclined surface approaches the surface of the substrate in the direction away from the center plane.

11. The display device according to claim 10, wherein each of the protrusions comprises a symmetry plane, the center plane is symmetrical with respect to the symmetry plane, the third inclined surface is symmetrical to the first inclined surface with respect to the symmetry plane, and the fourth inclined surface is symmetrical to the second inclined surface with respect to the symmetry plane.

12. The display device according to claim 10, wherein each of the protrusions further comprises:
a fifth inclined surface connected to the center plane, and connected between the first inclined surface and the third inclined surface, wherein the fifth inclined surface extends away from the surface of the substrate in the direction away from the center plane;
a sixth inclined surface connected between the fifth inclined surface and the surface of the substrate, and connected between the second inclined surface and the fourth inclined surface, wherein the sixth inclined surface is disposed on a side of the fifth inclined surface away from the center plane, and the sixth inclined surface approaches the surface of the substrate in the direction away from the center plane;
a seventh inclined surface connected to the center plane, and connected between the first inclined surface and the third inclined surface, wherein the seventh inclined surface extends away from the surface of the substrate in the direction away from the center plane; and
an eighth inclined surface connected between the seventh inclined surface and the surface of the substrate, and connected between the second inclined surface and the fourth inclined surface, wherein the eighth inclined surface is disposed on a side of the seventh inclined surface away from the center plane, and the eighth inclined surface approaches the surface of the substrate in the direction away from the center plane.

13. The display device according to claim 12, wherein each of the protrusions comprises a first symmetry plane and a second symmetry plane, the first symmetry plane is perpendicular to the second symmetry plane, the center plane is symmetrical with respect to the first symmetry plane and the second symmetry plane, the third inclined surface is symmetrical to the first inclined surface with respect to the first symmetry plane, the fourth inclined surface is symmetrical to the second inclined surface with respect to the first symmetry plane, the seventh inclined surface is symmetrical to the fifth inclined surface with respect to the second symmetry plane, and the eighth inclined surface is symmetrical to the sixth inclined surface with respect to the second symmetry plane.

14. The display device according to claim 9, wherein each of the protrusions is a frustum with a recess, the recess is a frustum with an inverted trapezoidal cross-section, a bottom surface of the recess is the center plane, one side surface of the recess is the first inclined surface, and an outer side surface of the frustum is the second inclined surface.

15. The display device according to claim 9, wherein the display panel is a liquid crystal display panel, and the display device further comprises an upper polarizer disposed on the light-emitting side of the liquid crystal display panel, the upper polarizer serves as the substrate, the protrusions are disposed on the upper polarizer, and an anti-reflection film is disposed on a light-emitting side of the optical film.

16. The display device according to claim 9, wherein the display panel is an organic light-emitting diode display panel, the organic light-emitting diode display panel comprises an encapsulation layer, the encapsulation layer comprises a first encapsulation layer and a second encapsulation layer disposed on the first encapsulation layer, the substrate of the optical film is the first encapsulation layer, and the protrusions are the second encapsulation layer.

* * * * *